(12) United States Patent
Birkbeck

(10) Patent No.: US 11,075,604 B2
(45) Date of Patent: Jul. 27, 2021

(54) RF FREQUENCY MULTIPLIER WITHOUT BALUN

(71) Applicant: pSemi Corporation, San Diego, CA (US)

(72) Inventor: John Birkbeck, New Milton (GB)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/584,720

(22) Filed: Sep. 26, 2019

(65) Prior Publication Data

US 2021/0099130 A1    Apr. 1, 2021

(51) Int. Cl.
| | | |
|---|---|---|
| H03B 19/00 | (2006.01) | |
| H03D 7/14 | (2006.01) | |
| H04B 1/40 | (2015.01) | |

(52) U.S. Cl.
CPC ......... *H03D 7/1441* (2013.01); *H03D 7/1408* (2013.01); *H03D 7/1483* (2013.01); *H04B 1/40* (2013.01)

(58) Field of Classification Search
CPC .... H03D 7/1441; H03D 7/125; H03D 7/1433; G06G 7/14; G06G 7/16; H03K 5/00006; H03K 5/1565; H03L 7/0814; H03L 7/0812; G06F 7/68
USPC ................... 327/116, 119, 355–364
See application file for complete search history.

(56) References Cited

U.S. PATENT DOCUMENTS

| | | | | |
|---|---|---|---|---|
| 5,826,183 A * | 10/1998 | Apel | ...................... | H03B 19/14 455/326 |
| 8,937,514 B2 * | 1/2015 | Cavus | .................. | H03D 7/1441 331/109 |
| 9,780,728 B1 * | 10/2017 | Salameh | .............. | H03D 7/1458 |
| 10,855,225 B1 * | 12/2020 | Taghivand | ........... | H03B 5/1212 |
| 2014/0022830 A1 * | 1/2014 | Luo | ....................... | H02M 1/126 363/157 |
| 2014/0184282 A1 * | 7/2014 | Chu | ....................... | H03B 19/14 327/120 |
| 2014/0361815 A1 * | 12/2014 | Depaoli | ................. | H03B 5/124 327/122 |

FOREIGN PATENT DOCUMENTS

CS                  273522 B1 *  3/1991

* cited by examiner

*Primary Examiner* — Quan Tra
(74) *Attorney, Agent, or Firm* — Jaquez Land Greenhaus & McFarland LLP; John Land, Esq.

(57) ABSTRACT

Radio frequency (RF) mixer circuits having a complementary frequency multiplier module that requires no balun to multiply a lower frequency base oscillator signal to a higher frequency local oscillator (LO) signal, and which has a significantly reduced IC area compared to balun-based frequency multipliers. In one embodiment, the complementary frequency multiplier module includes a complementary pair of FETs controlled by an applied base oscillator signal. The complementary FETs are coupled to a common-gate FET amplifier and alternate becoming conductive in response to the base oscillator signal. The alternating switching of the complementary FETs in response to the opposing phases of the base oscillator signal cause the common-gate FET amplifier to output a higher frequency local oscillator (LO) signal. The LO signal is coupled to the LO input of a mixer or mixer core of a type suitable for use in conjunction with a frequency multiplier.

17 Claims, 15 Drawing Sheets

700

800

Conversion Performance over LO Frequency (3.5 GHz IF)

RF FREQUENCY MULTIPLIER WITHOUT BALUN

BACKGROUND

(1) Technical Field

This invention relates to electronic circuitry, and more particularly to radio frequency mixers and frequency multipliers.

(2) Background

Many modern electronic systems include radio frequency (RF) one-way transmitters and receivers, and/or two-way transceivers; examples include personal computers, tablet computers, wireless network components, televisions, cable system "set top" boxes, radar systems, and cellular telephones. For purposes of this disclosure, the term "transceivers" includes one-way transmitters and/or receivers, unless specifically noted otherwise.

Many RF transceivers are quite complex radios that transmit and receive RF signals. In some cases, RF transceivers are capable of transmitting and receiving across multiple frequencies in multiple bands; for instance, in the United States, the 2.4 GHz band is divided into 14 channels spaced about 5 MHz apart. As another example, a modern "smart telephone" may include RF transceiver circuitry capable of concurrently operating on different cellular communications systems (e.g., GSM and CDMA), on different wireless network frequencies and protocols (e.g., IEEE 802.1abgn at 2.4 GHz at 2.4 GHz and 5 GHz), and on "personal" area networks (e.g., Bluetooth based systems).

A frequency mixer (or just "mixer") is an electrical circuit that creates new frequencies from two applied signals. More particularly, in their simplest form, mixers are 3-port active or passive devices designed to yield both a sum and a difference frequency at a single output port when two distinct input frequencies are inserted into the other two ports. Thus, when two signals at frequencies $f_1$ and $f_2$ are applied to a mixer, the intended output is a product signal of the sum $f_1+f_2$ and difference $f_1-f_2$ of the original frequencies.

In common RF applications, a mixer has three ports: a local oscillator (LO) port, an RF port, and an intermediate frequency (IF) port. In down-conversion mixers, information impressed upon an RF signal is translated, either directly or in multiple steps, to a baseband domain where the information is further processed. Up-conversion mixers typically translate baseband information up to an RF signal for transmission from the RF system. Considering a down-conversion mixer as an example, the LO port is where an LO signal f2 is applied and the RF port is where an RF signal f1 is applied (see above). The IF port is where a down-converted RF signal (now called an IF signal) is output from the mixer, or, for a single-step down-conversion mixer, the output of the IF port is the base band signal. For an up-conversion mixer, an IF or a baseband signal is input into the IF port and a modulated RF signal is output from the RF port. The inputs to a mixer may be complex waveforms, such as a signal spectrum (e.g., in CDMA cellular telephone systems) or a broad spectrum of signals (e.g., cable TV). In practice, mixers also produce harmonic frequencies and higher order sum and difference frequencies.

Mixers have a variety of uses, particularly in RF-based electronic systems. For example, mixers are widely used to shift signals from a first frequency range to a second frequency range, a process known as heterodyning, for convenience in transmission or further signal processing of received signals. In addition, a mixer can be used as a phase detector, modulator, or demodulator, among other uses. A mixer can be characterized by its linearity, which is a measure of how well the mixer converts applied signals into a desired output while minimizing unwanted signals such as harmonics or higher order mixing products. The harmonic frequencies and higher order sum and difference frequencies output by mixers are the principal reason that linearity is important in mixer design.

Mixers come in a variety of topologies for various applications. A particularly valuable topology is the double balanced mixer, used primarily to improve linearity beyond that of a single balanced mixer, especially for even-order mixing products. Typically, a double balanced mixer (DBM) has both its inputs applied to differential circuits, so that neither of the input signals and only the product signal appears at the output. The most common form of DBM is the diode DBM. In its simplest form, the diode DBM consists of two unbalanced-to-balanced inductor-based transformers (also known as "balun" transformers or simply "baluns") and four diodes connected in a ring.

FIG. 1 is a schematic diagram of an RF circuit that includes a prior art diode-ring double balanced mixer 100 and a prior art frequency multiplier 120. In the diode-ring double balanced mixer 100, a first balun 102 is configured to receive an LO signal at a port on the unbalanced (single inductor) side of the balun 102 and generate two balanced LO output signals on the balanced (double inductor) side of the balun 102 that are coupled to two corresponding opposing nodes T1, T2 of a diode ring 104. The ring diode 104 often comprises Schottky diodes, but may comprise other switching elements such as conventional diodes or field-effect transistors (FETs) configured as diodes. A second balun 106 is configured to receive or pass an RF signal at a corresponding RF port on the unbalanced side of the second balun 106. The two legs of the balanced side of the second balun 106 couple the RF signal to the remaining two opposing nodes of the diode ring 104. An IF signal port is coupled to the center tap of the second balun 106.

The LO signal input to a mixer 100 is generally a sine wave at a frequency chosen to generate the output frequency of the mixer (IF for a down-converter and RF for an up-converter, see above). In some applications, particularly an RF system with multiple mixers or for very high frequencies at which generating LO power can be power hungry or difficult, it is beneficial to generate a base oscillator signal that is at a lower frequency than the frequency desired for input to the LO port of a mixer 100. For example, the generated base oscillator signal may be at a frequency of one-half of the LO signal frequency (i.e., LO/2). The lower base frequency typically can be generated and distributed to multiple mixers more efficiently, with less power consumption or loss, than a signal at the LO frequency desired for input to the LO port of a mixer 100. A frequency multiplier may be used to convert the generated base oscillator signal to the higher frequency LO signal.

For example, referring to FIG. 1, the LO input may be generated from an LO/2 signal by a frequency multiplier 120. The LO/2 signal itself may be generated by other circuitry in a conventional fashion, and typically would be a sine wave (although other wave forms may be used). In the illustrated example, which omits biasing and other circuitry for clarity of the main points, the LO/2 signal is applied to the unbalanced (single inductor) side of a balun 122. The two legs of the balanced (double inductor) side of the balun 122 each couple opposite phases of the LO/2 signal to the gates of a pair of N-MOS field effect transistors (FETs) M1$n$, M2$n$, which are alternately activated (i.e., are switched ON) by the opposing phases of the LO/2 signal. The drains of the FETs M1$n$, M2$n$ are coupled to the source of a common-gate N-MOS FET amplifier M3$n$, while the sources of the FETs M1$n$, M2$n$ are coupled to circuit ground. In some embodiments, the FET amplifier M3$n$ may have a DC bias voltage $V_{BIAS}$ applied to its gate. The alternating switching of the N-MOS FETs M1$n$, M2$n$ in response to the opposing phases of the LO/2 signal causes the common-gate N-MOS FET amplifier M3$n$ to output an LO signal which contains the strong second harmonic required. The direction of current flow I is indicated by an arrow.

In the illustrated embodiment, an exemplary filter 124 may be used to remove the DC component of the LO signal and suppress or eliminate certain frequencies (e.g., unwanted higher RF harmonics) from the LO signal before application of the LO signal to the LO port of the mixer 100. The filter 124 may be a simple series capacitor or may be a more complex circuit designed to remove higher frequencies. A load inductor L between $V_{DD}$ and the output of the frequency multiplier 120 prevents that output from being pinned at $V_{DD}$.

The trend in the electronics industry, particularly with respect to low-power handheld RF transceiver-based products such as cell phones and the like, is for integrated circuit (IC) dimensions to continue to decrease and for the amount of circuitry per IC to continue to increase. Thus, the IC area or "real estate" occupied by circuitry becomes an even more valuable resource to be optimized. While a balun-based frequency multiplier 120 works reasonably well, baluns are typically among the largest devices on such ICs, and their size typically scales inversely to frequency. Hence, IF baluns are typically the largest and an LO/2 balun may be the next largest in a frequency multiplier/frequency mixer system. Accordingly, there is a need for mixer circuits having a frequency multiplier that conserves IC area. The present invention meets this and other needs.

SUMMARY

The present invention encompasses radio frequency (RF) mixer circuits having a complementary frequency multiplier module comprising one or more complementary frequency multipliers that require no balun, which multiply a lower frequency base oscillator signal to a higher frequency local oscillator (LO) signal, and which have a significantly reduced IC area compared to balun-based frequency multipliers. Combining a balun-less complementary frequency multiplier module with a co-designed frequency mixer enables high bandwidth, high performance embodiments that are particularly useful in portable applications utilizing one or more RF transceivers.

In one embodiment, a complementary frequency multiplier includes a complementary pair of FETs—an N-MOS FET and a P-MOS FET—having gates controlled by an applied base oscillator signal (e.g., one-half the frequency of the LO signal). The N-MOS FET and the P-MOS FET are coupled to a common-gate FET amplifier. The N-MOS FET will switch ON (become conductive) when the LO/2 signal voltage is positive. Conversely, the P-MOS FET will switch ON (become conductive) when the LO/2 signal voltage is negative. The alternating switching of the N-MOS FET and the P-MOS FET in response to the opposing phases of the LO/2 signal cause the common-gate FET amplifier to output an LO signal which contains the desired strong second harmonic. Two or more complementary frequency multipliers may be cascaded within a complementary frequency multiplier module to enable a further reduction of the frequency of the base oscillator signal. The common-gate FETs of such complementary frequency multipliers may be "stacked" to withstand higher voltages and produce higher output power. In different configurations, the common-gate FET amplifier may be based on one or more N-MOS FETs or P-MOS FETs.

The LO signal output of a complementary frequency multiplier module is coupled to the LO input of a mixer or mixer core. The mixer or mixer core may be of any type suitable for use in conjunction with a frequency multiplier, and may be, for example, a diode-ring double balanced mixer, a quad-FET ring mixer, a Gilbert cell, a FET-based mixer of the type shown in U.S. Pat. No. 9,780,728 (issued Oct. 3, 2017, entitled "Doubled Balanced Mixer", and assigned to the assignee of the present invention; the contents of that patent are hereby incorporated by reference), or another type of compatible mixer circuit suitable for particular applications. In any case, the mixer or mixer core may include filter circuitry to suppress, eliminate, or shape certain frequencies.

In one embodiment, a complementary frequency multiplier module includes dual complementary frequency multipliers coupled to a filter/coupling circuit and a mixer core. The filter/coupling circuit replaces the LO balun of a conventional mixer, may be tuned to filter out harmonic frequencies from the LO signal frequency generated by the dual complementary frequency multipliers, and enables coupling the dual complementary frequency multipliers in a "push-pull" configuration that doubles the voltage to the LO Input of the mixer core, which results in four times the power input to the mixer core.

The small size of the complementary frequency multipliers allows each mixer or mixer core in a system to have a dedicated complementary frequency multiplier module, while enabling distribution of a lower frequency (e.g., LO/2) base oscillator signal throughout an IC, with attendant benefits.

Since mixer circuits are critical elements of modern RF transmitters, receivers, and transceivers, the small size of embodiments of the present invention is particularly beneficial in a wide variety of larger radio frequency (RF) circuits and systems useful in a variety of applications, such as radio systems (including cellular radio systems), radar systems (including phased array and automotive radar systems), and test equipment.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses radio frequency (RF) mixer circuits having a complementary frequency multiplier module comprising one or more complementary frequency multipliers that require no balun, which multiply a lower frequency base oscillator signal to a higher frequency local oscillator (LO) signal, and which have a significantly reduced IC area compared to balun-based frequency multipliers. Combining a balun-less complementary frequency multiplier module with a co-designed frequency mixer enables high bandwidth, high performance embodiments that are particularly useful in portable applications utilizing one or more RF transceivers.

Figure 2A:
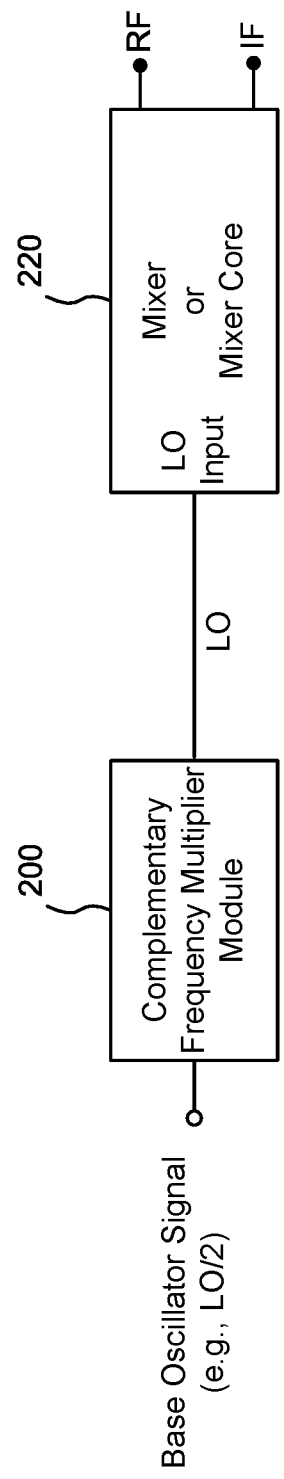
FIG. 2A is a block diagram of an RF circuit that includes a complementary frequency multiplier module in accordance with the present invention, coupled to a mixer.

FIG. 2A is a block diagram of an RF circuit that includes a complementary frequency multiplier module 200 in accordance with the present invention, coupled to a mixer or mixer core 220. The complementary frequency multiplier module 200 includes one or more complementary frequency multipliers that require no balun, configured to multiply an applied lower frequency base oscillator signal (e.g., LO/2) and output a higher frequency local oscillator (LO) signal. The mixer or mixer core 220 is of a type suitable for use in conjunction with a frequency multiplier and has an LO input coupled to the LO signal.

Figure 2B:
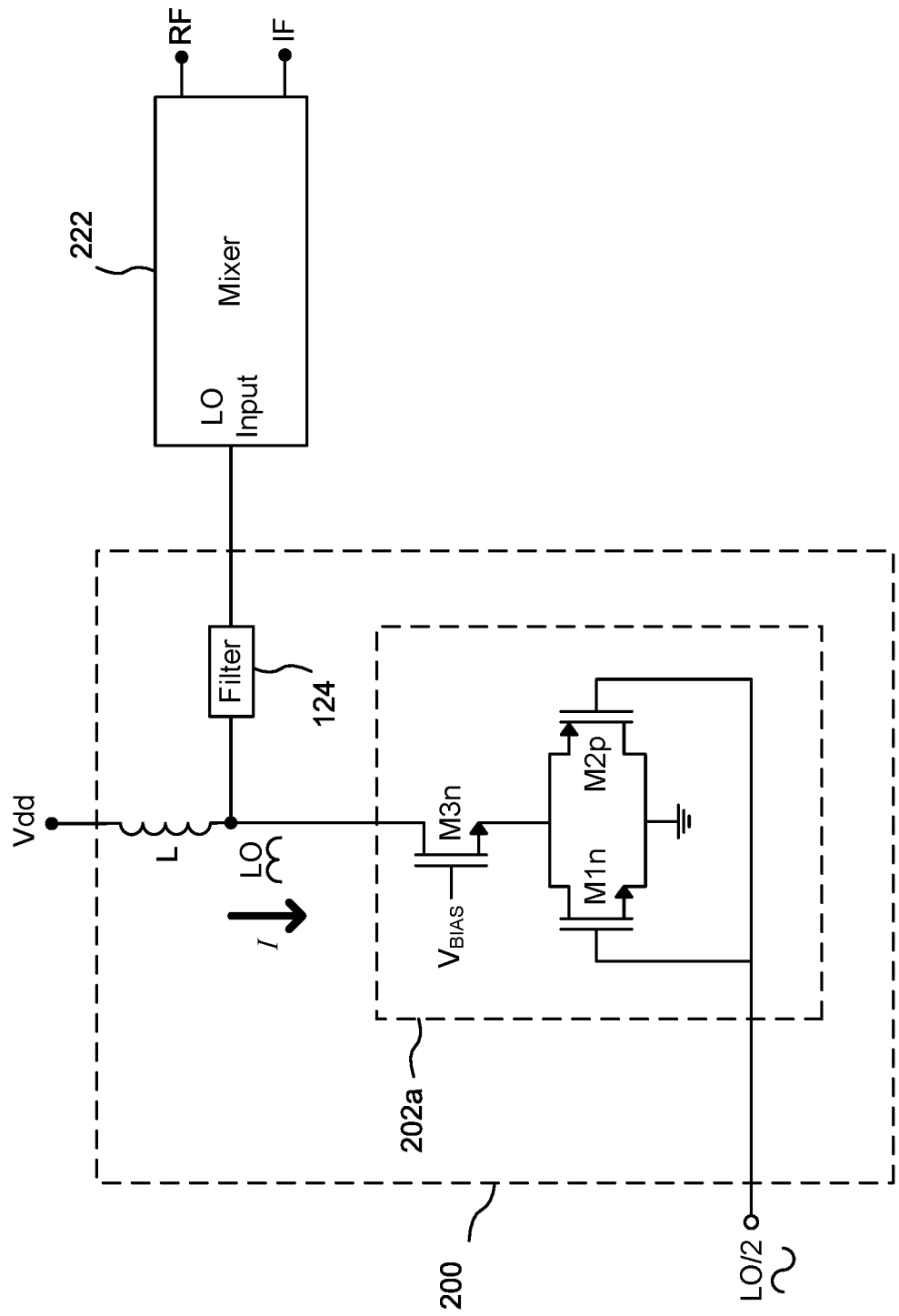
FIG. 2B is a schematic diagram of an RF circuit that includes a first embodiment of a complementary frequency multiplier in accordance with the present invention, coupled to a mixer.

FIG. 2B is a schematic diagram of an RF circuit that includes a first embodiment of a complementary frequency multiplier 202a in accordance with the present invention, coupled to a mixer 222. In the illustrated embodiment, the complementary frequency multiplier module 200 includes a complementary frequency multiplier 202a that converts an applied base oscillator signal frequency LO/2 to a target local oscillator (LO) frequency. The mixer 222 has an LO input coupled to the LO signal and RF and IF ports, either of which may be configured as an input port while the other is configured as an output port as described above for up or down conversion mixers. The complementary frequency multiplier 202a may be coupled to the mixer 222 through an optional filter 124 (which may be required if the LO Input of the mixer 222 has an internal connection to ground). The filter 124 may be used to remove the DC component of the LO signal and suppress or eliminate certain frequencies (e.g., unwanted higher RF harmonics) from the LO signal before application of the LO signal to the LO Input of the mixer 222.

In greater detail, the complementary frequency multiplier 202a includes a complementary pair of FETs—an N-MOS FET M1n and a P-MOS FET M2p—coupled in parallel as devices (but anti-parallel with respect to their respective sources and drains) and having gates controlled by the applied LO/2 signal. The drain of the N-MOS FET M1n and the source of the P-MOS FET M2p are series-coupled to the source of a common-gate N-MOS FET amplifier M3n. The drain of the common-gate N-MOS FET amplifier M3n is coupled to a voltage source, $V_{DD}$, typically via a load element such as the illustrated inductor L; in alternative embodiments, the load element may be, for example, a resistor. The source of the N-MOS FET M1n and the drain of the P-MOS FET M2p are coupled to circuit ground. (Note that biasing circuitry for the various FETs is omitted to avoid clutter.)

The N-MOS FET M1n will switch ON (become conductive) when the LO/2 signal voltage is positive. Conversely, the P-MOS FET M2p will switch ON (become conductive) when the LO/2 signal voltage is negative. The alternating switching of the N-MOS FET M1n and the P-MOS FET M2p in response to the opposing phases of the LO/2 signal cause the common-gate N-MOS FET amplifier M3n to generate a series of current pulses (indicated by the "M" shaped waveform next to the "LO" label) at twice the input LO/2 frequency, or more specifically, at the desired LO frequency. The direction of current I flowing into the common-gate N-MOS FET amplifier M3n is indicated by an arrow.

It may be noted that the common gate FET amplifier M3n is a relatively efficient circuit for allowing current flow through the M1n and M2p pair of FETs. In a simpler configuration, it might be possible to eliminate FET M3n (i.e., replacing it with a short) and to include a load element (e.g., the illustrated inductor L or a resistor) between $V_{DD}$ and FET M3n; however both these combinations would be lossy compared to the common gate amplifier version.

Figure 2C:
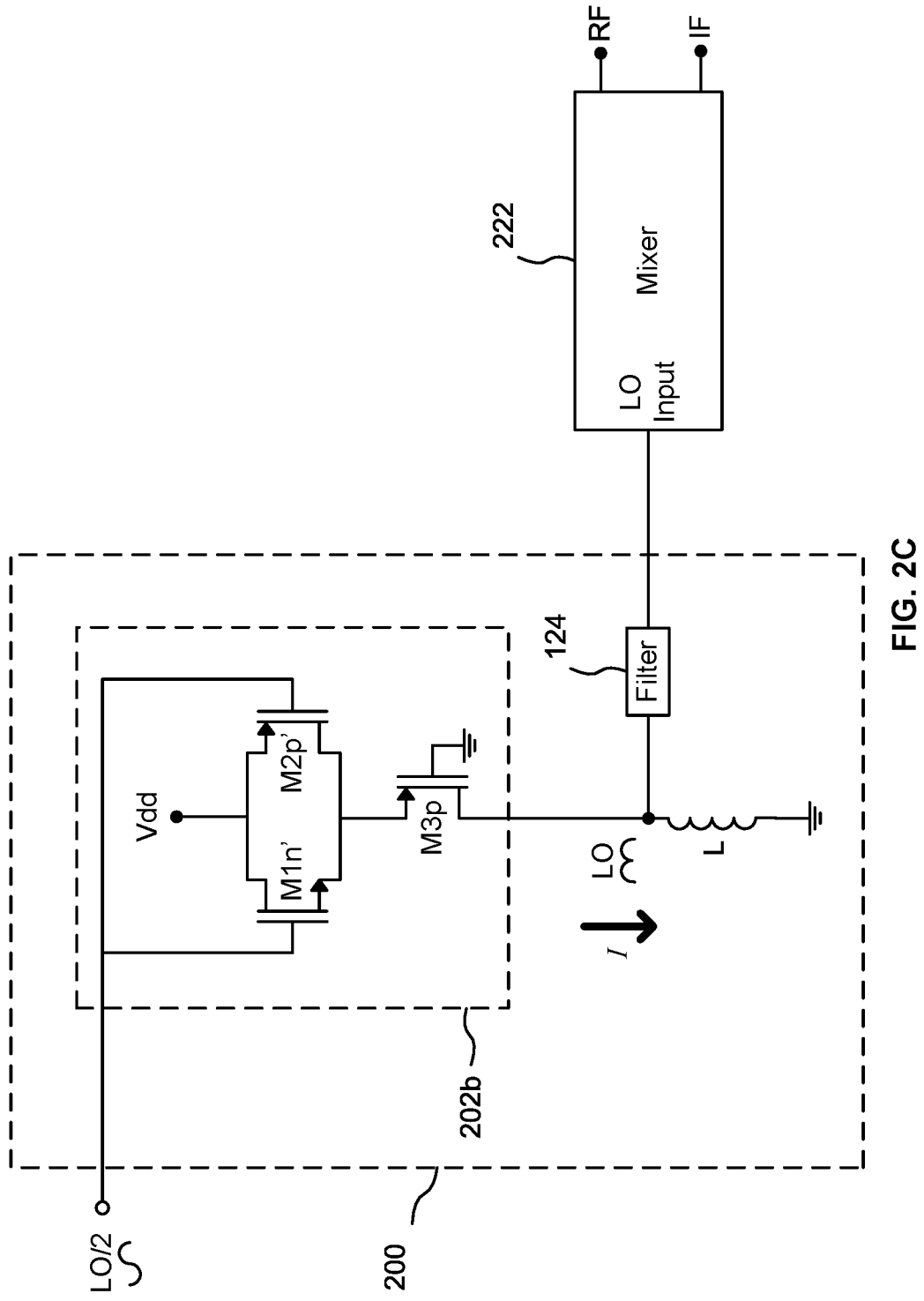
FIG. 2C is a schematic diagram of an RF circuit that includes a second embodiment of a complementary frequency multiplier in accordance with the present invention, coupled to a mixer.

In an alternative embodiment, a voltage-complementary frequency multiplier includes a common-gate P-MOS FET amplifier M3p driven by parallel coupled transistor devices M1n' and M2p' to output a series of current pulses at twice the input LO/2 frequency, or more specifically, at the desired LO frequency. For example, FIG. 2C is a schematic diagram of an RF circuit that includes a second embodiment of a complementary frequency multiplier 202b in accordance with the present invention, coupled to a mixer 222. In the illustrated embodiment, the complementary frequency multiplier module 200 includes a complementary frequency multiplier 202b that still includes a complementary pair of FETs—an N-MOS FET M1n' and a P-MOS FET M2p'—coupled in parallel and having gates controlled by the applied LO/2 signal. However, the source of the N-MOS FET M1n' and the drain of the P-MOS FET M2p' are series-coupled to the source of a common-gate P-MOS FET amplifier M3p. The drain of the common-gate P-MOS FET amplifier M3p is coupled to circuit ground through a load element such as the illustrated inductor L; in alternative embodiments, the load element may be, for example, a resistor (biasing circuitry is left out for clarity). The drain of the N-MOS FET M1n' and the source of the P-MOS FET M2p' are coupled to a voltage source $V_{DD}$. The N-MOS FET M1n' will switch ON (become conductive) when the LO/2 signal voltage is positive. Conversely, the P-MOS FET M2p' will switch ON (become conductive) when the LO/2 signal voltage is negative. The alternating switching of the N-MOS FET M1n' and the P-MOS FET M2p' in response to the opposing phases of the LO/2 signal cause the common-gate P-MOS FET amplifier M3p to generate a series of current pulses (indicated by the "M" shaped waveform next to the "LO" label) at twice the input LO/2 frequency, or more specifically, at the desired LO frequency. The direction of current I flowing out of the common-gate P-MOS FET amplifier M3p is indicated by an arrow.

In general, the P-MOS FETs M2p, M2p' in FIGS. 2B and 2C are preferably selected to have performance characteristics comparable to the parallel N-MOS FETs M1n, M1n' with respect to such parameters as transconductance, breakdown voltage, noise, and amplification characteristics, etc. As IC design rules scale down (e.g., from 130 nm to 45 nm), the performance of PMOS FETs generally more closely aligns with the performance of N-MOS FETs, however, a person of ordinary skill will understand that the current invention is beneficial at any set of design rules with a proper choice of FET parameters, such as (by way of example only) width/length and $V_T$ parameters.

Figure 2D:
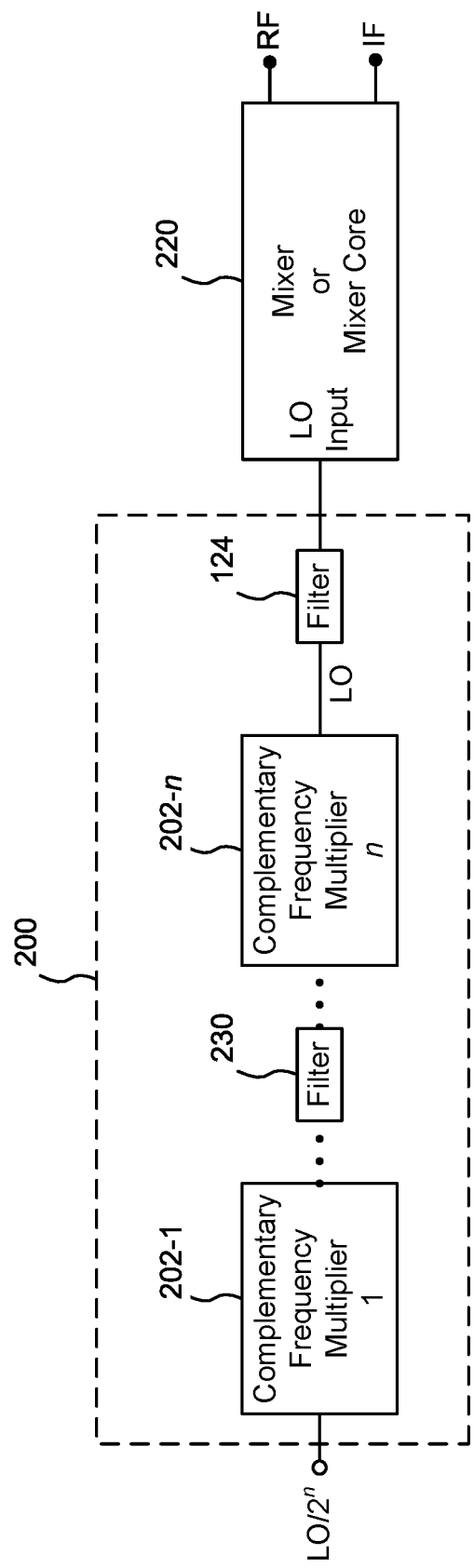
FIG. 2D is a schematic diagram of a third RF circuit that includes n cascaded complementary frequency multipliers in accordance with the present invention, coupled to a mixer.

Two or more complementary frequency multipliers 202a, 202b may be cascaded within a complementary frequency multiplier module 200. Such a cascaded configuration of complementary frequency multipliers 202a, 202b allows the base oscillator signal frequency to be other than LO/2, such as one-quarter of LO (i.e., LO/4) or one-eighth of LO (i.e., LO/8). For example, FIG. 2D is a schematic diagram of a third RF circuit that includes n cascaded complementary frequency multipliers 202-1 to 202-n in accordance with the present invention, coupled to a mixer or mixer core 220. The cascaded complementary frequency multipliers 202-1 to 202-n may be separated by interposed filters 230 to remove the DC component of the output signal of each previous stage and optionally to suppress, eliminate, or shape certain frequencies. The base oscillator signal frequency input into the first complementary frequency multiplier 202-1 would be $LO/2^n$, where n is the number of cascaded complementary frequency multiplier stages.

Figure 1:
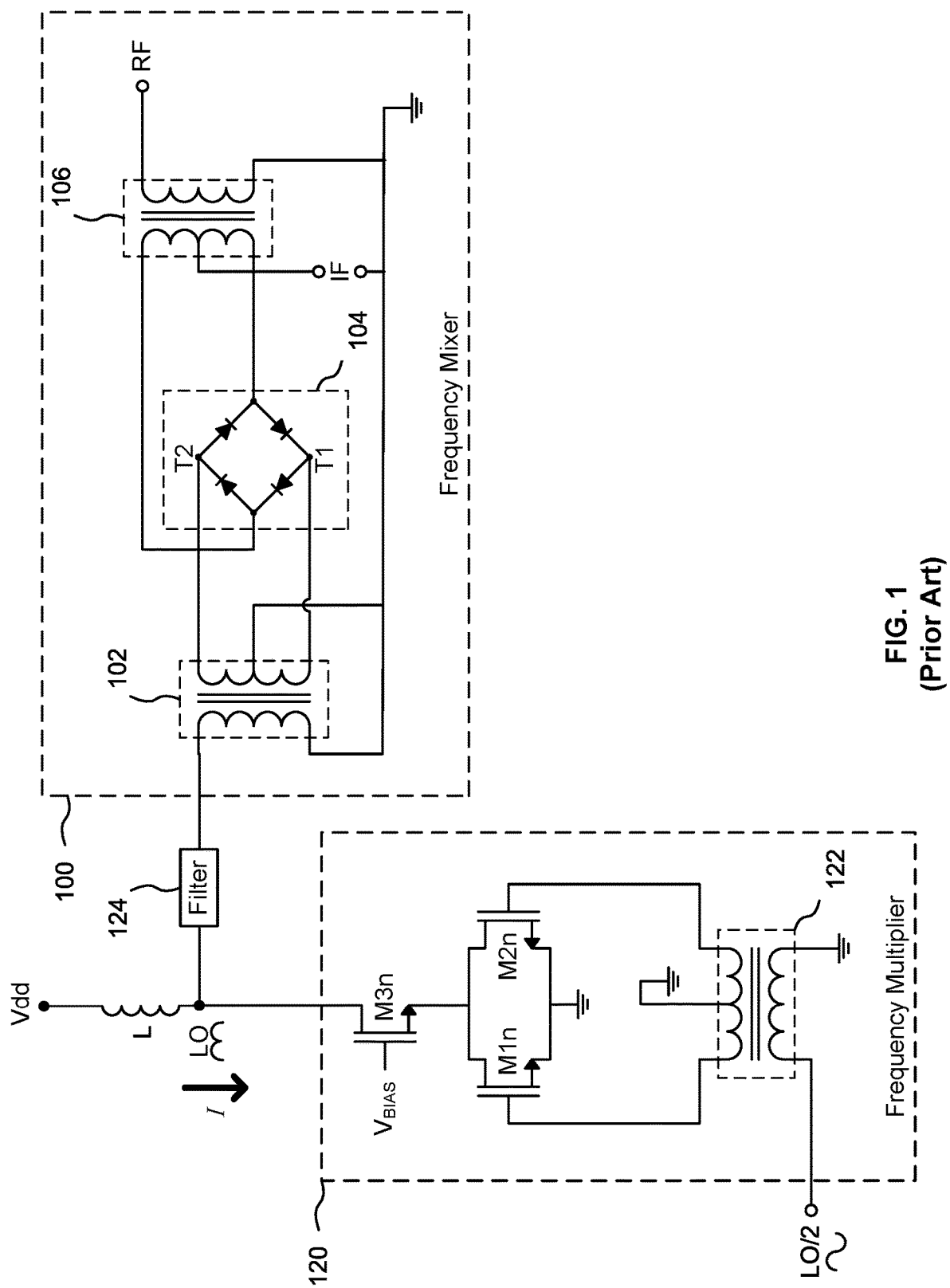
FIG. 1 is a schematic diagram of an RF circuit that includes a prior art diode-ring double balanced mixer and a prior art frequency multiplier.

Comparing the complementary frequency multipliers 202a, 202b of FIGS. 2B and 2C to the conventional frequency multiplier 120 of FIG. 1, the complementary frequency multipliers 202a, 202b of FIGS. 2B and 2C notably lack a balun 122 with its attendant sets of large inductors. Accordingly, the IC area consumed by the complementary frequency multipliers 202a, 202b is much smaller than a conventional frequency multiplier 120 using the same IC design rules.

Figure 3:
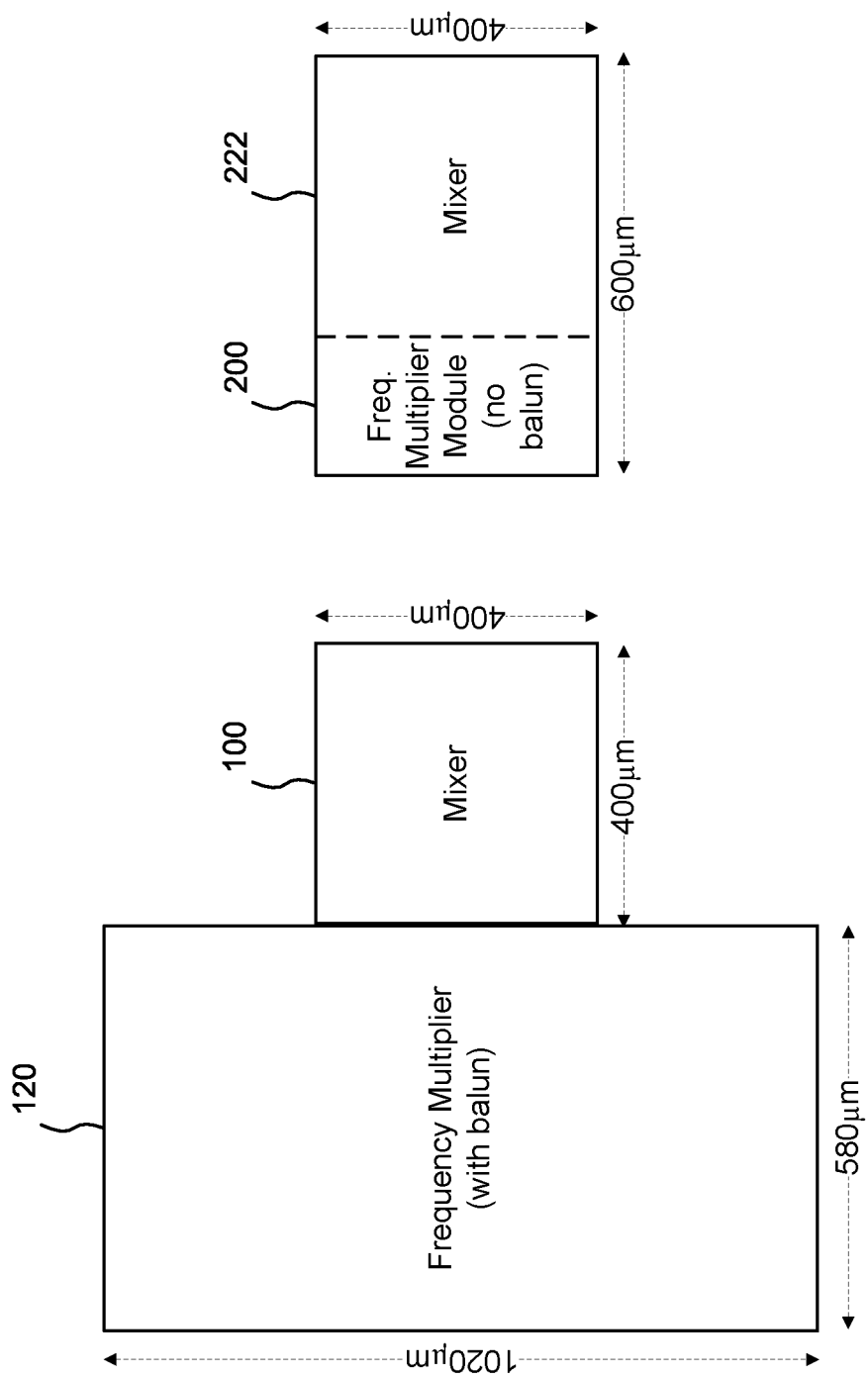
FIG. 3 is a diagram showing an approximation of the sizes of the conventional frequency multiplier and the mixer of FIG. 1 compared to the sizes of the complementary frequency multiplier and the mixer of FIG. 2B using the same IC design rules.

For example, FIG. 3 is a diagram showing an approximation of the sizes of the conventional frequency multiplier 120 and the mixer 100 of FIG. 1 compared to the sizes of the complementary frequency multiplier module 200 and the mixer 222 of FIG. 2B using the same IC design rules and type of mixer. The baluns needed for the conventional frequency multiplier 120 consume a quite large area of an IC—in this example, the conventional frequency multiplier 120 is more than 7 times larger than the complementary frequency multiplier module 200. (Note that that dashed line between the complementary frequency multiplier module 200 and the mixer 222 indicates that the delineation between the two circuits is not an exact line; since no baluns are required for the complementary frequency multiplier module 200, a tighter integration is possible between the circuitry of the complementary frequency multiplier module 200 and the mixer 222).

Mixer Examples

The mixer 222 of FIGS. 2B-2D may be of any type suitable for use in conjunction with a frequency multiplier, and may be, for example, a diode-ring double balanced mixer like the type shown in FIG. 1, a quad-FET ring mixer (see further description below with respect to FIG. 5), a Gilbert cell, a FET-based mixer of the type shown in U.S. Pat. No. 9,780,728 (issued Oct. 3, 2017, entitled "Doubled Balanced Mixer"), or another type of compatible mixer circuit suitable for particular applications. Several examples of such mixers and a complementary frequency multiplier module 200 having a particular complementary frequency multiplier 202a are described in this section. In any case, the mixer 222 may include filter circuitry to suppress, eliminate, or shape certain frequencies, as is known in the art.

Figure 4:
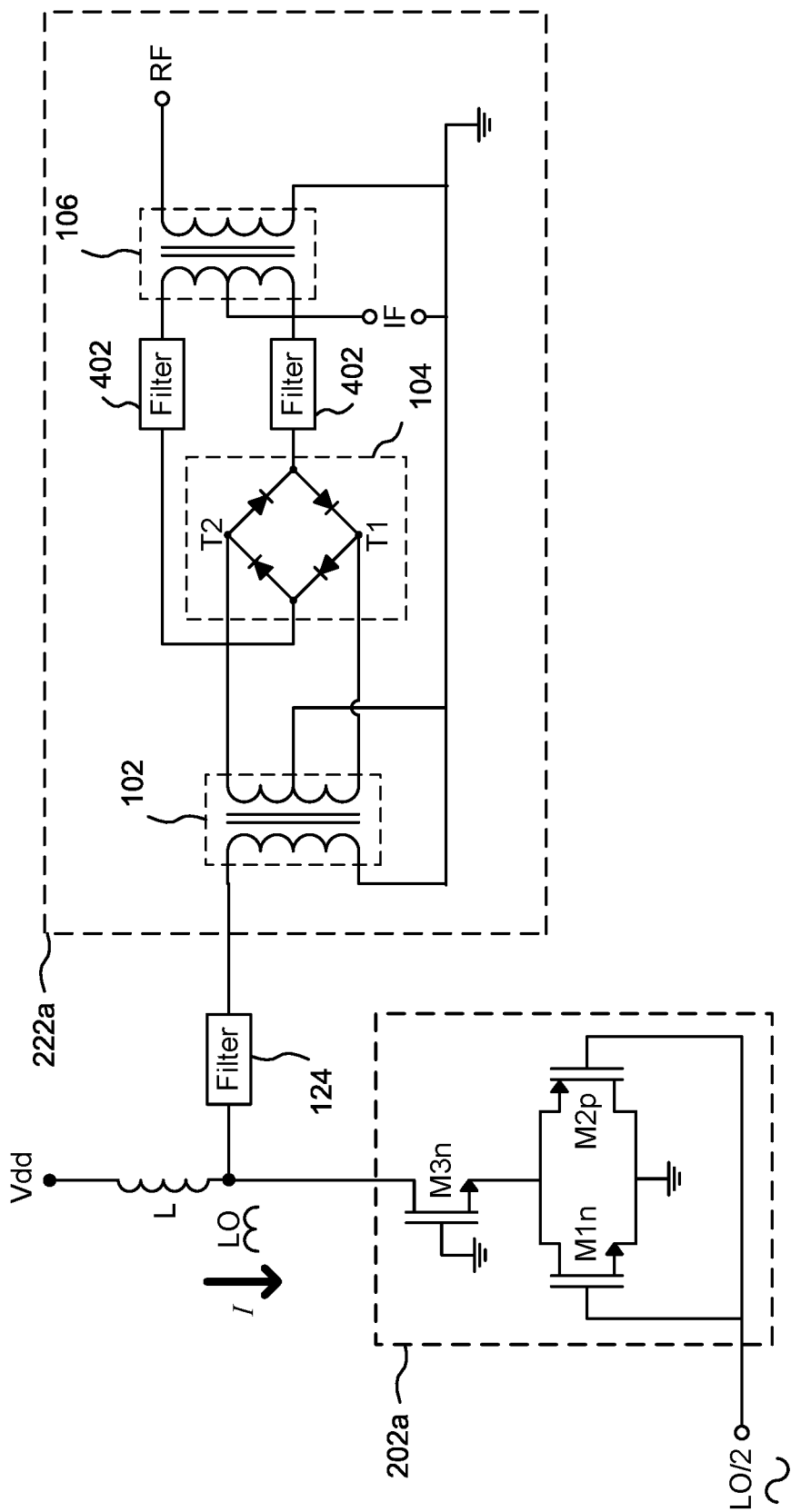
FIG. 4 is a schematic diagram of a complementary frequency multiplier and a first type of mixer.

FIG. 4 is a schematic diagram of a complementary frequency multiplier 202a and a first type of mixer 222a. In the illustrated embodiment, the complementary frequency multiplier 202a is coupled through a filter 124 to the mixer 222a (note that lines denoting the complementary frequency multiplier module 200 are omitted to avoid clutter). In this example, the mixer 222a is a diode-ring double balanced mixer of the type shown in FIG. 1 and operates in the same way. The baluns 102, 106 used in the diode-ring double balanced mixer are relatively small since the RF and LO frequencies are much higher than typical IF signal frequencies as well as about twice the LO/2 frequency and inductor size scales inversely with frequency. The illustrated mixer 222a includes filters 402 to suppress, eliminate, or shape certain frequencies, as is known in the art.

Figure 5:
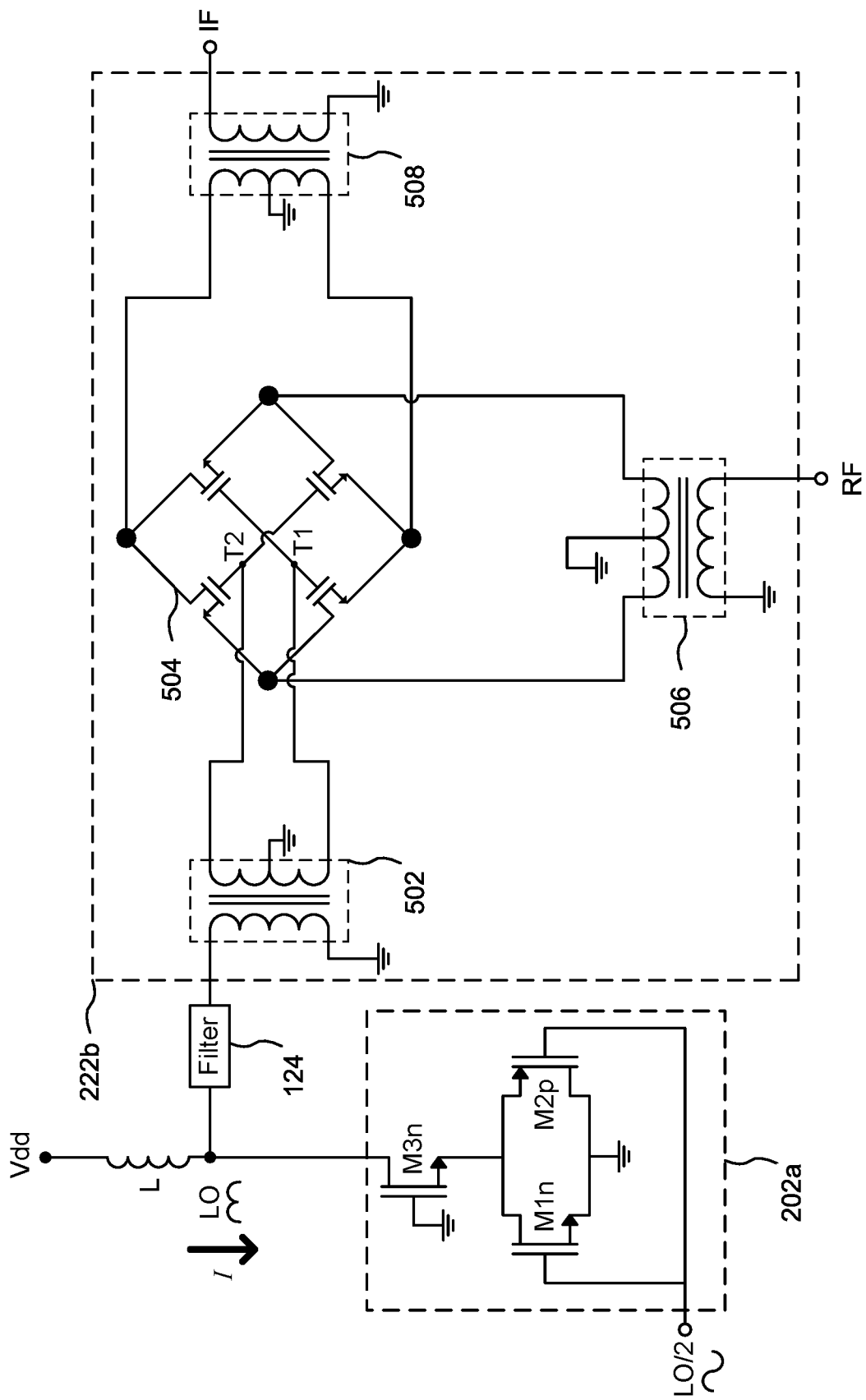
FIG. 5 is a schematic diagram of a complementary frequency multiplier and a second type of mixer.

FIG. 5 is a schematic diagram of a complementary frequency multiplier 202a and a second type of mixer 222b. The complementary frequency multiplier 202a is coupled through a filter 124 to the mixer 222b (again, the lines denoting the complementary frequency multiplier module 200 are omitted to avoid clutter). The mixer 222b is a conventional quad-FET ring double balanced mixer. As is known in the art, the balanced side of an LO balun 502 is coupled at nodes T1 and T2 to the gates of a pair of opposing FETs in a ring 504 of four FETs. An RF balun 506 is coupled to a first pair of opposing nodes of the quad-FET ring 504, and an IF balun 508 is coupled to a second pair of opposing nodes of the quad-FET ring 504. In most cases, a quad-FET ring double balanced mixer will exhibit higher performance than other types of mixers, since commencement of conduction of the ring FETs is dependent on the gate signal applied at T1 and T2, and not on diode voltage threshold characteristics, which are typically higher. Again, the RF and LO baluns used in the quad-FET ring double balanced mixer are relatively small, since the frequencies are at least twice LO/2 and inductor size scales inversely with frequency. However, an advantage of the mixer 222a shown in FIG. 4 as compared to the mixer 222b shown in FIG. 5 is the lack of an IF balun 508, which may be relatively large.

Which mixer to use for a particular application is often a matter of design choice. One factor to take into account in making such a choice is that the LO Input drive requirement may vary considerably between different types of mixers. However, high drive requirements may be achieved by including a suitable amplifier between the LO output of a complementary frequency multiplier module 200 and the LO Input of a mixer or mixer core 220. In addition, at a system level, it may be desirable to reduce the LO/2 drive into a complementary frequency multiplier module 200, and for this purpose a pre-amplifier can be included before the module (see FIG. 6 below for an example).

Figure 6:
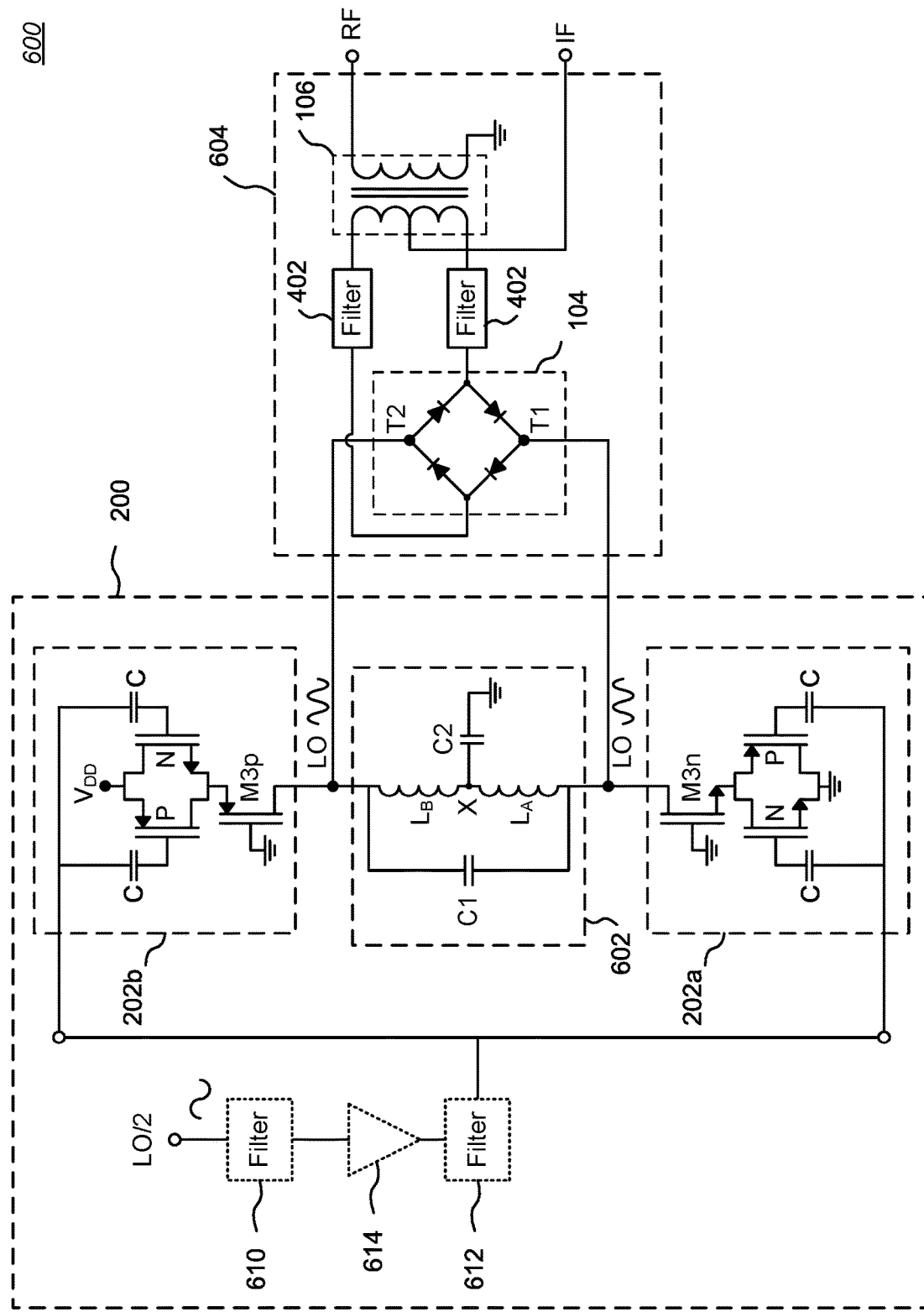
FIG. 6 is a schematic diagram of a complementary frequency multiplier module having dual complementary frequency multipliers and a filter/coupling circuit coupled to a mixer core.

Because a complementary frequency multiplier module 200 lacks IC area-consuming baluns, the circuitry of a complementary frequency multiplier module 200 can be more tightly integrated with the circuitry of a mixer. For example, FIG. 6 is a schematic diagram 600 of a complementary frequency multiplier module 200 having dual complementary frequency multipliers 202a, 202b and a filter/coupling circuit 602 coupled to a mixer core 604. In the illustrated embodiment, an LO/2 signal, which may be passed through one or more optional filters 610, 612 and/or an optional pre-amplifier 614 (to reduce input power requirements), is simultaneously applied to dual complementary frequency multipliers 202a, 202b (biasing circuitry for the various FETs is omitted to avoid clutter). Any DC content of the LO/2 signal is removed by capacitors C before application of the LO/2 signal to the gates of the complementary P-type and N-type FETs within the dual complementary frequency multipliers 202a, 202b.

The respective outputs of the dual complementary frequency multipliers 202a, 202b output signals are applied in parallel to the filter/coupling circuit 602 and to opposite corners of an exemplary mixer ring 104 in the mixer core 604. The filter/coupling circuit 602 presents a high impedance at the LO frequency and a lower impedance at other frequencies. Hence, currents at the LO frequency flow in the diode quad of the mixer ring 104, whereas currents at other frequencies flow in the low impedance filter/coupling circuit 602 (note that filter 124 in earlier figures provided this filtering function as a series circuit element, whereas the filter/coupling circuit 602 provides filtering of unwanted harmonics by parallel shunt). Hence, a voltage waveform with a very strong LO content develops across the parallel filter/coupling circuit 602 and mixer ring 104. For simplicity, these voltage waveforms can be considered as opposite-phase sinusoidal waveforms, as depicted in FIG. 6. The polarity of the voltage across the parallel filter/coupling circuit 602 and mixer ring 104 network switches every half cycle of the LO signal, hence the current in the diode quad of the mixer ring 104 also changes direction at the LO frequency, resulting in proper mixer operation. Thus, the illustrated configuration of dual complementary frequency multipliers 202a, 202b can be regarded as operating in a "push-pull" manner, effectively doubling the LO drive voltage and therefore increasing effective LO power applied by 6 dB, a major benefit of the dual complementary frequency multiplier architecture of FIG. 6.

The respective LO outputs of the dual complementary frequency multipliers 202a, 202b are applied to a filter/coupling circuit 602 and to the LO Input nodes T1, T2 of the mixer core 604. The filter/coupling circuit 602 includes series-coupled inductors $L_A$, $L_B$ that are also coupled to respective LO outputs of the complementary frequency multipliers 202a, 202b. A capacitor C1 spans both of the series-coupled inductors $L_A$, $L_B$, as shown. The center node X between the series-coupled inductors $L_A$, $L_B$ is coupled through an RF shunt capacitor C2 to circuit ground. Capacitor C1 is parallel resonant with the $L_A+L_B$ inductors at the LO frequency, and the high impedance produced forces currents at the LO frequency to flow in the differential LO input to the mixer core 604. Inductors $L_A$, $L_B$ are preferably symmetrically sized and adjusted in value to tune the center frequency. Capacitor C1 may similarly be tuned also to alter the center frequency. Capacitor C2 is preferably sized to provide a ground return for the lower frequency IF currents.

As should be clear, the filter/coupling circuit 602 functions in lieu of the LO balun 102 of the mixer 222a of FIG. 4 (the mixer core 604 in this example otherwise being of the same design as the mixer 222a of FIG. 4). However, note that in other embodiments of the example circuit shown in FIG. 6, the mixer core 604 may have a different configuration, such as the quad-FET ring mixer 222b of FIG. 5 (omitting the LO balun 502).

In summary, the filter/coupling circuit 602 provides several key functions. The DC path through inductors $L_A$, $L_B$ allow for shared current bias between the dual complementary frequency multipliers 202a, 202b. The stacking of the dual complementary frequency multipliers 202a, 202b allows for higher voltage operation which in turn increases the LO signal drive capability. Since the dual complementary frequency multipliers 202a, 202b drive the filter/coupling circuit 602 equally from both sides, a differential signal results on the T1 and T2 nodes in the mixer core 604. In other words, the combination of the dual complementary frequency multipliers 202a, 202b and the filter/coupling circuit 602 also provides the required unbalanced to balanced conversion, hence a dedicated LO balun is not required. As described above, the components can be tuned to parallel resonance at the LO frequency to force the LO current to flow into the mixer core 604. Frequencies above and below resonance will tend to flow more through the filter/coupling circuit 602 and less through the mixer core 604. It will be appreciated that additional tuned circuits can be added within the filter/coupling circuit 602 to enhance rejection of certain frequencies if required, providing that the DC path and general symmetry is maintained. Finally, the RF shunt capacitor C2 at the point of symmetry (i.e., at node X) of the filter/coupling circuit 602 provides the same function as the grounded center tap of the balun 102 of FIG. 1 by providing a current path to circuit ground for the applied IF signal to flow.

It should be appreciated that variants of the above example embodiments may be designed without departing from the scope of the invention. For example, to withstand higher applied voltages, one or more of the FETs M1n, M2p, M1', M2n', M3n, M3p of any of the complementary frequency multipliers 202a, 202b may be configured as a stack of two or more series-connected FET devices configured to function as a single FET. In many embodiments, only the common-gate FET amplifier M3n or M3p need have a stacked-FET configuration. Embodiments configured for high voltage operation by stacking FETs within a complementary frequency multiplier are particularly useful for integration with amplifiers which operate from higher voltages, such as power amplifiers and low noise amplifiers (LNAs).

Benefits

Embodiments of the invention provide a number of benefits, especially substantial IC area space savings. The small size of the complementary frequency multiplier module 200 allows each mixer in a system to have a dedicated frequency multiplier, while enabling distribution of a lower frequency (e.g., LO/2) base oscillator signal throughout an IC, with attendant benefits. As noted above, two or more complementary frequency multipliers may be cascaded within a complementary frequency multiplier module 200 to allow the base oscillator signal frequency to be different from LO/2, and a complementary frequency multiplier 202*a*, 202*b* may be configured for high voltage operation by replacing one or more of the illustrated single FETs with a corresponding stack of series-coupled FET devices configured to function as a single FET.

Figure 7:
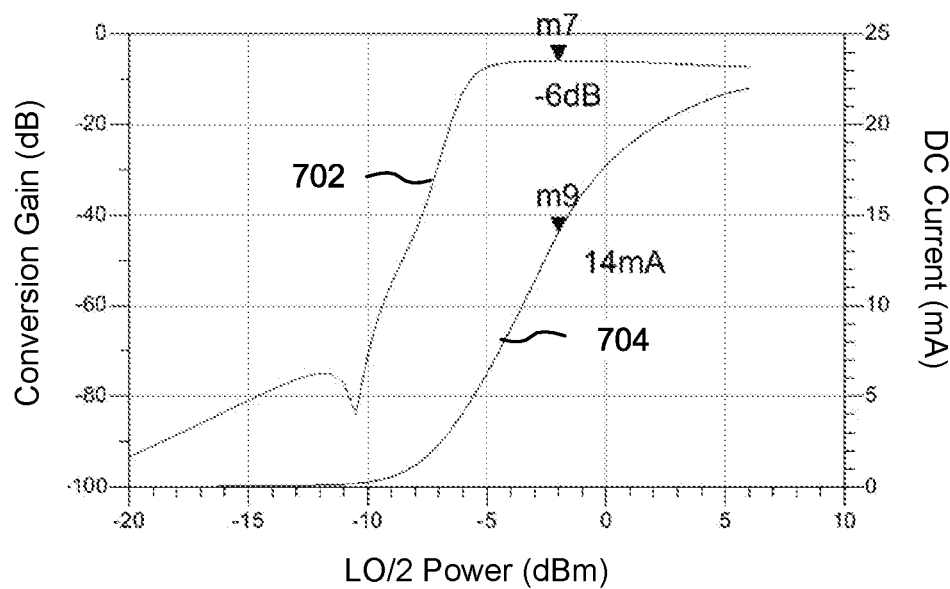
FIG. 7 is a graph showing two comparisons, conversion gain as a function of LO/2 power, and DC current as a function of LO/2 power, for a modeled up-conversion version of the circuit shown in FIG. 6.

An additional benefit of the invention is high performance. For example, FIG. 7 is a graph 700 showing two comparisons, conversion gain as a function of LO/2 power, and DC current as a function of LO/2 power, for a modeled up-conversion version of the circuit shown in FIG. 6. Graph line 702 shows that in the region in which the complementary frequency multiplier module 200 can provide adequate drive to the mixer ring 104 diodes (from about −5 dBm to about 5 dBm in this example), the conversion gain of the modeled mixer (i.e., a comparison of RF power to IF power) is about −6 dB. Graph line 704 shows that at the optimum conversion gain point (at marker m7, corresponding to about −2 dBm of LO/2 power), the DC current draw of the circuit is only about 14 mA (at marker m9).

Figure 8:
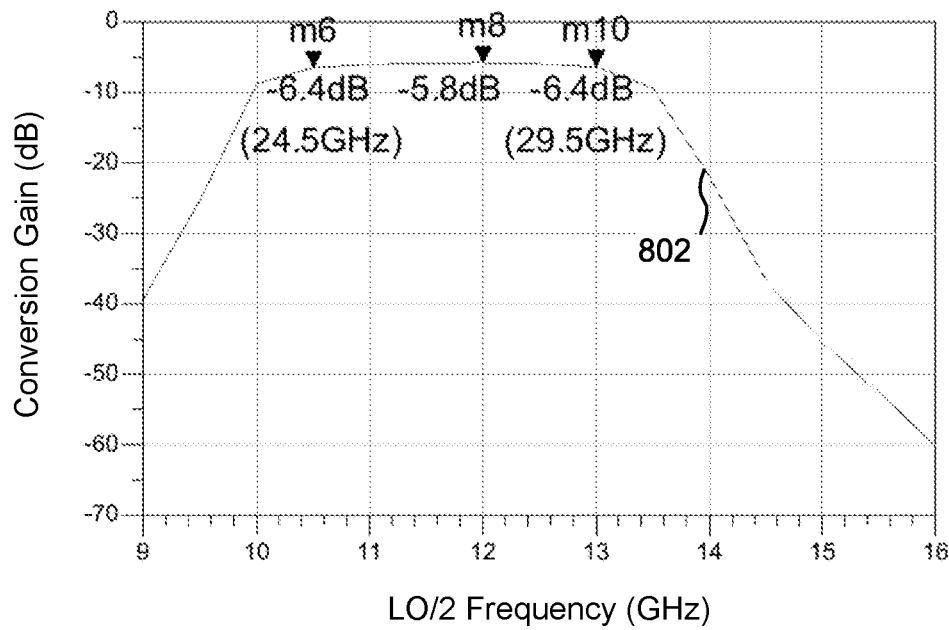
FIG. 8 is a graph showing a comparison of conversion gain as a function of LO/2 frequency for a modeled up-conversion version of the circuit shown in FIG. 6.

As another example, FIG. 8 is a graph 800 showing a comparison of conversion gain as a function of LO/2 frequency for a modeled up-conversion version of the circuit shown in FIG. 6. Graph line 802 shows that the modeled circuit has about a 5 GHz RF bandwidth (from about 24.5 GHz at marker m6 to about 29.5 GHz at marker m10), based on a 3.5 GHz IF input, with a conversion gain of about −6.4 dB to about −5.8 dB.

System Aspects

Since mixer circuits are critical elements of modern RF transmitters, receivers, and transceivers, the small size of embodiments of the present invention is particularly beneficial in a wide variety of larger radio frequency (RF) circuits and systems useful in a variety of applications, such as radio systems (including cellular radio systems), radar systems (including phased array and automotive radar systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.10a, b, g, ac, ax), as well as other radio communication standards and protocols.

Figure 9:
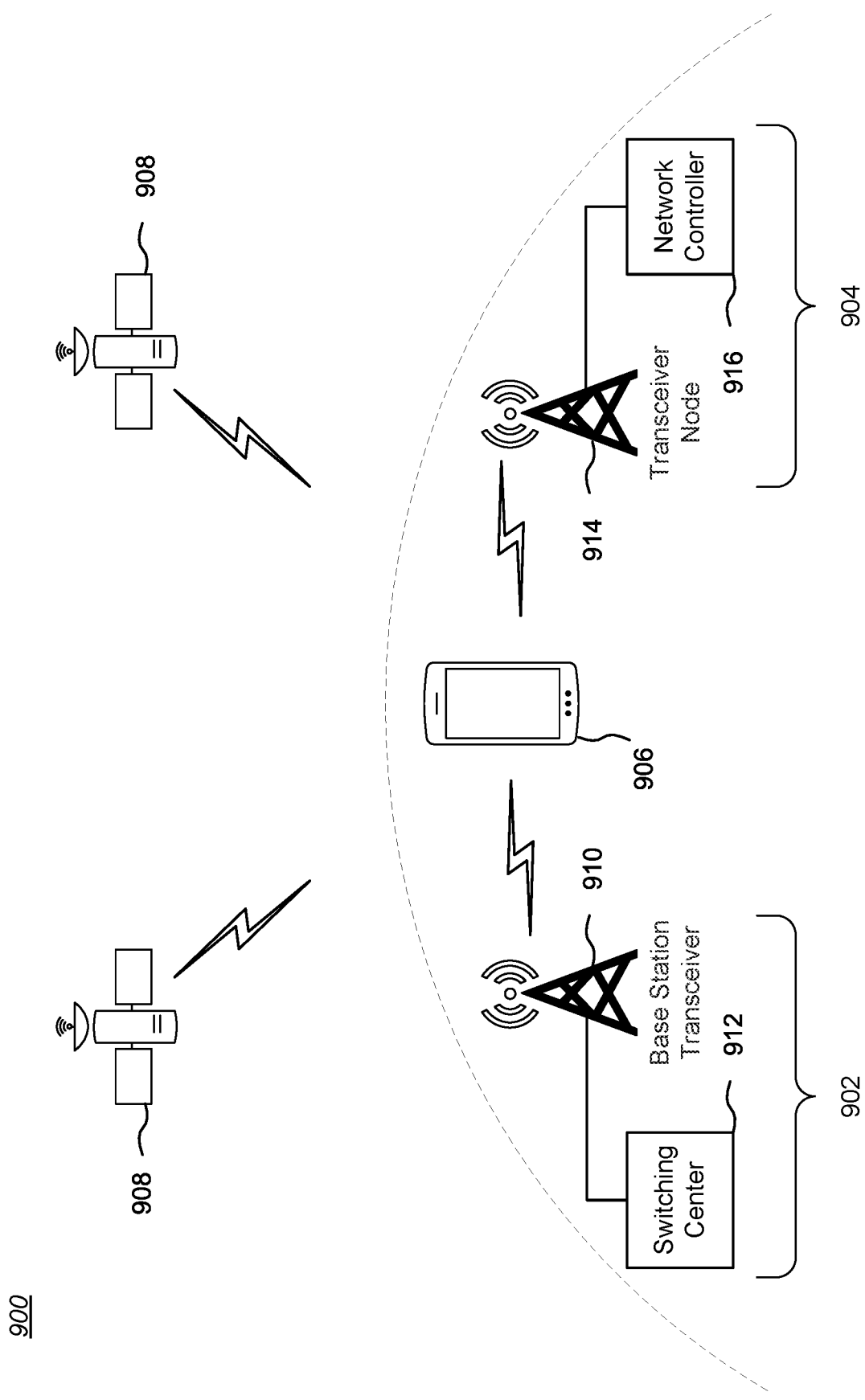
FIG. 9 illustrates an exemplary prior art wireless communication environment comprising different wireless communication systems, and may include one or more wireless devices.

As an example of wireless RF system usage, FIG. 9 illustrates an exemplary prior art wireless communication environment 900 comprising different wireless communication systems 902 and 904, and which may include one or more wireless devices 906.

A wireless device 906 may be capable of communicating with multiple wireless communication systems 902, 904 using, for example, one or more of the telecommunication protocols noted above. A wireless device 906 also may be capable of communicating with one or more satellites 908, such as navigation satellites (e.g., GPS) and/or telecommunication satellites. The wireless device 906 may be equipped with multiple antennas, externally and/or internally, for operation on different frequencies and/or to provide diversity against deleterious path effects such as fading and multi-path interference. A wireless device 906 may be a cellular phone, a personal digital assistant (PDA), a wireless-enabled computer or tablet, or some other wireless communication unit or device. A wireless device 906 may also be referred to as a mobile station, user equipment, an access terminal, or some other terminology.

The wireless system 902 may be, for example, a CDMA-based system that includes one or more base station transceivers (BSTs) 910 and at least one switching center (SC) 912. Each BST 910 provides over-the-air RF communication for wireless devices 906 within its coverage area. The SC 912 couples to one or more BSTs in the wireless system 902 and provides coordination and control for those BSTs.

The wireless system 904 may be, for example, a TDMA-based system that includes one or more transceiver nodes 914 and a network controller (NC) 916. Each transceiver node 914 provides over-the-air RF communication for wireless devices 906 within its coverage area. The NC 916 couples to one or more transceiver nodes 914 in the wireless system 904 and provides coordination and control for those transceiver nodes 914.

In general, each BST 910 and transceiver node 914 is a fixed station that provides communication coverage for wireless devices 906, and may also be referred to as base stations or some other terminology. The SC 912 and the NC 916 are network entities that provide coordination and control for the base stations and may also be referred to by other terminologies.

Figure 10:
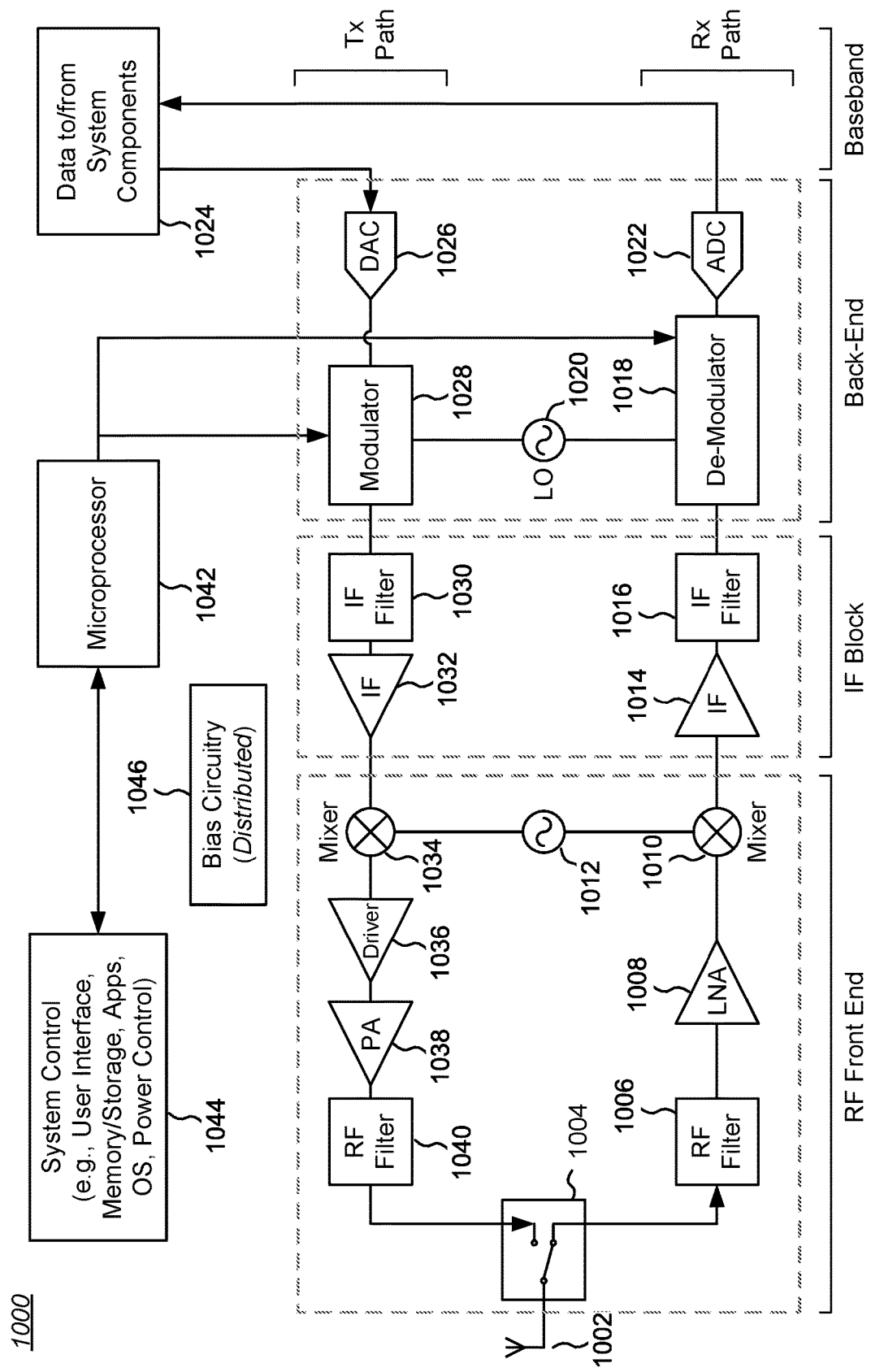
FIG. 10 is a block diagram of a transceiver that might be used in a wireless device, such as a cellular telephone, including a "smart phone".

An important aspect of any wireless system, including the systems shown in FIG. 9, is in the details of how the component elements of the system perform. FIG. 10 is a block diagram of a transceiver 1000 that might be used in a wireless device, such as a cellular telephone, including a "smart phone", or as part of a wired RF-based system (e.g., cable or wired network). As illustrated, the transceiver 1000 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 1002 and a switching unit 1004, which may be implemented with active switching devices (e.g., field effect transistors or FETs), or with passive devices that implement frequency-domain multiplexing, such as a diplexer or duplexer. An RF filter 1006 passes desired received RF signals to a low noise amplifier (LNA) 1008, the output of which is combined in a mixer 1010 with the output of a base oscillator signal generator 1012 to produce an intermediate frequency (IF) signal. The IF signal may be amplified by an IF amplifier 1014 and subjected to an IF filter 1016 before being applied to a demodulator 1018, which may be coupled to a second local oscillator 1020. The demodulated output of the demodulator 1018 is transformed to a digital signal by an analog-to-digital converter 1022 and provided to one or more system components 1024 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1024 is transformed to an analog signal by a digital-to-analog converter 1026, the output of which is applied to a modulator 1028, which also may be coupled to the second local oscillator 1020. The modulated output of the modulator 1028 may be subjected to an IF filter 1030 before being amplified by an IF amplifier 1032. The output of the IF amplifier 1032 is then combined in a mixer 1034 with the output of the base oscillator signal generator 1012 to produce an RF signal. The RF signal may be amplified by a driver 1036, the output of which is applied to a power amplifier (PA) 1038. The amplified RF signal may be coupled to an RF filter 1040, the output of which is coupled to the antenna 1002 through the switching unit 1004.

The operation of the transceiver 1000 is controlled by a microprocessor 1042 in known fashion, which interacts with system control components (e.g., user interfaces, memory/storage devices, application programs, operating system software, power control, etc.). In addition, the transceiver 1000 will generally include other circuitry, such as bias circuitry 1046 (which may be distributed throughout the transceiver 1000 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1000 may be in a positioned in a different order (e.g., filters) or omitted. Other components can be (and usually are) added (e.g., additional filters, impedance matching networks, variable phase shifters/attenuators, power dividers, etc.). In some applications, only the receiver path Rx may be needed, and accordingly the circuitry for the transmitter path Tx may be omitted. Conversely, in some applications, only the transmitter path Tx may be needed, and accordingly the circuitry for the receiver path Rx may be omitted.

As should be appreciated from the above written description and accompanying figures, one or both of the critical mixers 1010, 1034 may include a complementary frequency multiplier, as described above, to multiply a lower frequency signal (e.g., LO/2) output by the base oscillator signal generator 1012 up to a desired LO frequency, with the attendant benefits of smaller IC area consumption, broadband performance, and distribution of the lower frequency base oscillator signal (e.g., LO/2).

Methods

Figure 11:
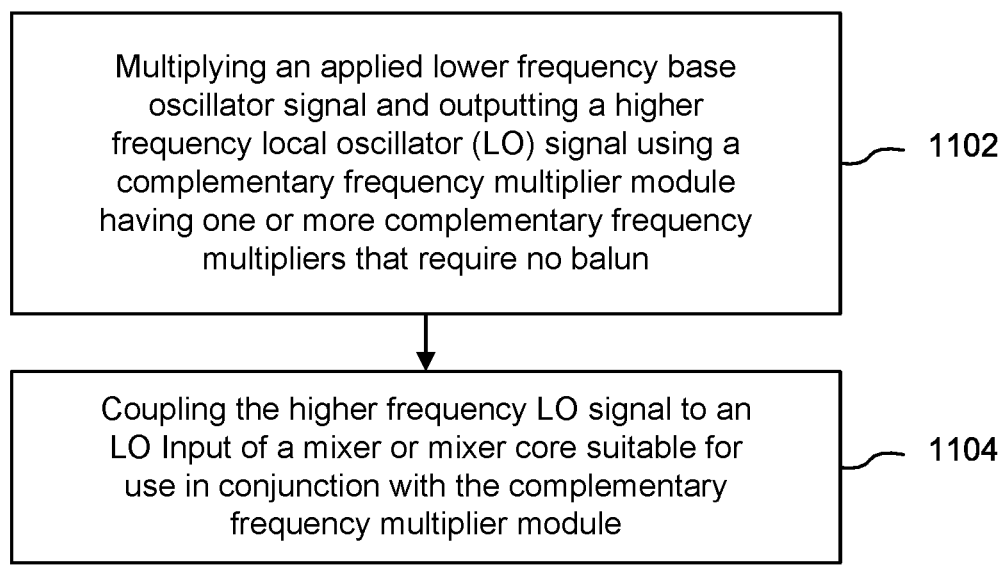
FIG. 11 is a process flow chart showing a first method for mixing frequencies using a local oscillator signal that is a multiple of a base oscillator signal.

Another aspect of the invention includes methods for mixing frequencies using a local oscillator signal that is a multiple of a base oscillator signal. For example, FIG. 11 is a process flow chart 1100 showing a first method for mixing frequencies using a local oscillator signal that is a multiple of a base oscillator signal. The method includes: multiplying an applied lower frequency base oscillator signal and outputting a higher frequency local oscillator (LO) signal using a complementary frequency multiplier module having one or more complementary frequency multipliers that require no balun (Block 1102); and coupling the higher frequency LO signal to an LO Input of a mixer or mixer core suitable for use in conjunction with the complementary frequency multiplier module (Block 1104).

Figure 12:
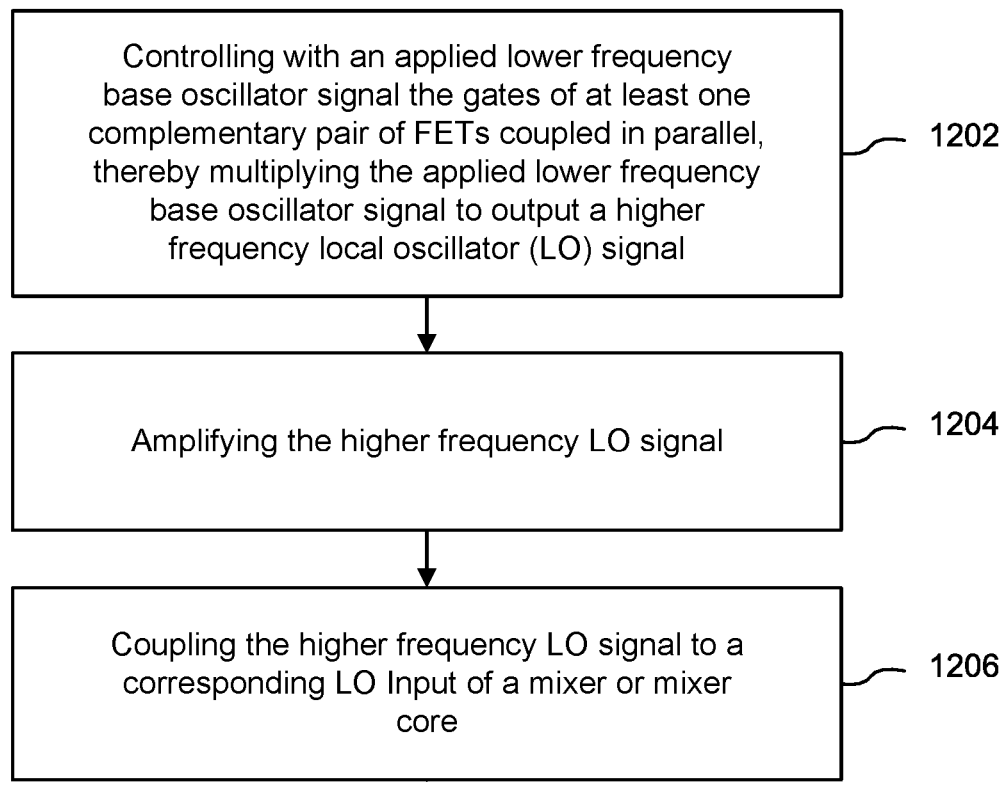
FIG. 12 is a process flow chart showing a second method for mixing frequencies using a local oscillator signal that is a multiple of a base oscillator signal.

As another example, FIG. 12 is a process flow chart 1200 showing a second method for mixing frequencies using a local oscillator signal that is a multiple of a base oscillator signal. The method includes: controlling with an applied lower frequency base oscillator signal the gates of at least one complementary pair of FETs coupled in parallel, thereby multiplying the applied lower frequency base oscillator signal to output a higher frequency local oscillator (LO) signal (Block 1202); amplifying the higher frequency LO signal (Block 1204); and coupling the higher frequency LO signal to a corresponding LO Input of a mixer or mixer core (Block 1206).

Figure 13:
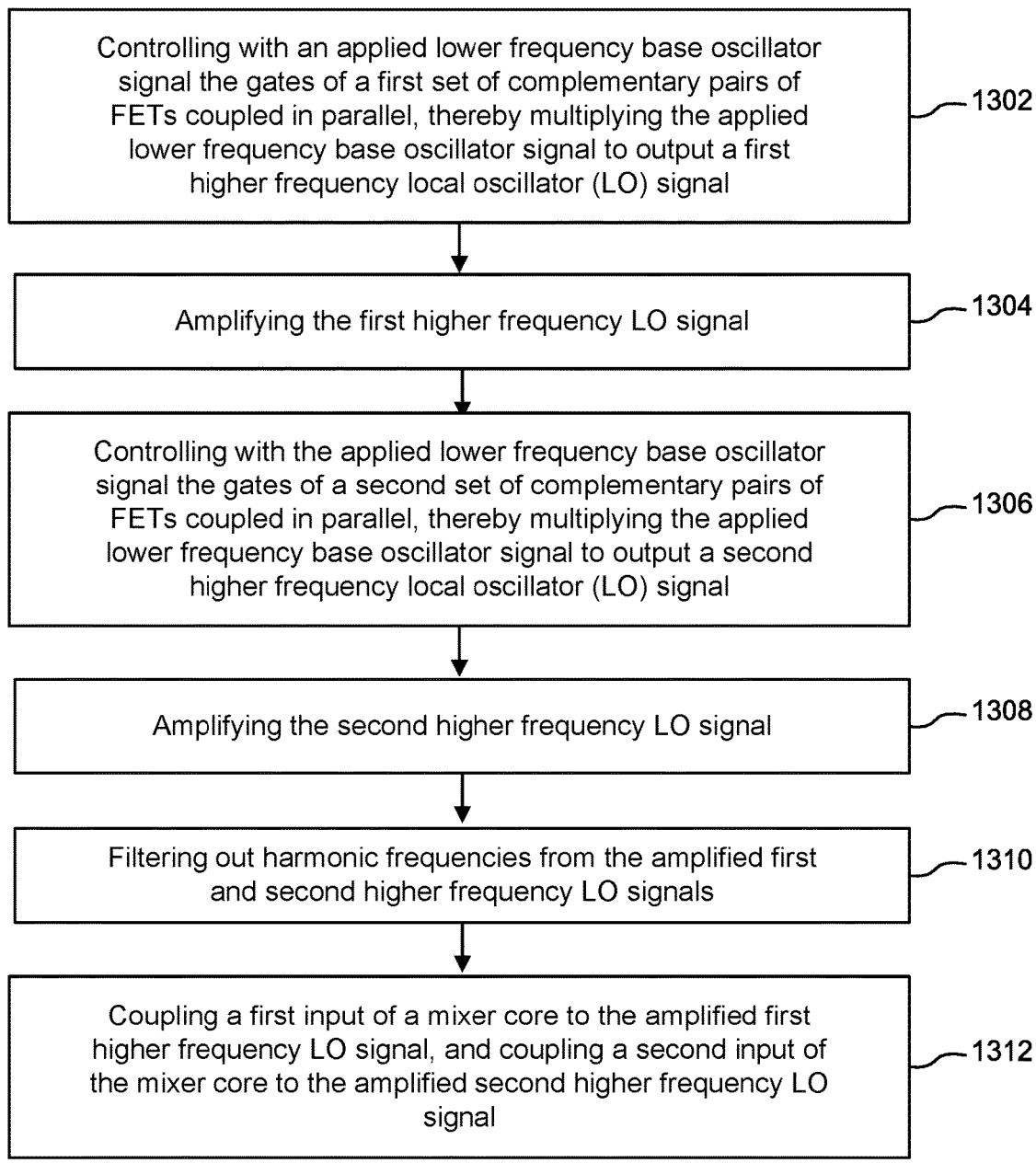
FIG. 13 is a process flow chart showing a third method for mixing frequencies using a local oscillator signal that is a multiple of a base oscillator signal.

As yet another example, FIG. 13 is a process flow chart 1300 showing a third method for mixing frequencies using a local oscillator signal that is a multiple of a base oscillator signal. The method includes: controlling with an applied lower frequency base oscillator signal the gates of a first set of complementary pairs of FETs coupled in parallel, thereby multiplying the applied lower frequency base oscillator signal to output a first higher frequency local oscillator (LO) signal (Block 1302); amplifying the first higher frequency LO signal (Block 1304); controlling with the applied lower frequency base oscillator signal the gates of a second set of complementary pairs of FETs coupled in parallel, thereby multiplying the applied lower frequency base oscillator signal to output a second higher frequency local oscillator (LO) signal (Block 1306); amplifying the second higher frequency LO signal (Block 1308); filtering out harmonic frequencies from the amplified first and second higher frequency LO signals (Block 1310); and coupling a first input of a mixer core to the amplified first higher frequency LO signal, and coupling a second input of the mixer core to the amplified second higher frequency LO signal (Block 1312).

Additional aspects of the above method may include one or more of the following: wherein the higher frequency LO signal is twice the frequency of the applied lower frequency base oscillator signal; wherein outputting the higher frequency LO signal includes outputting a series of current pulses at the LO frequency from at least one of the one or more complementary frequency multipliers; wherein multiplying the applied lower frequency base oscillator signal and outputting the higher frequency LO signal includes applying the lower frequency base oscillator signal to a complementary pair of FETs coupled in parallel and thereby generating a series of current pulses at the higher frequency LO signal; further including amplifying the series of current pulses at the higher frequency LO signal; wherein the complementary frequency multiplier module includes at least one complementary frequency multiplier; wherein the complementary frequency multiplier module outputs at least a first series of current pulses; wherein at least one complementary frequency multiplier includes a complementary pair of FETs coupled in parallel and having gates controlled by the applied lower frequency base oscillator signal, the complementary pair of FETs being series-coupled to a FET amplifier configured to output the higher frequency LO signal as a higher frequency LO signal; wherein the FETs within at least one of the complementary pair of FETs and/or any FET amplifier comprise a stack of series-coupled FET devices; wherein the mixer and/or mixer core includes one of a diode-ring double balanced mixer or a quad-FET ring mixer; including configuring n complementary frequency multipliers in a cascade to output the higher frequency LO signal by multiplying an applied lower base oscillator signal having a frequency of $LO/2^n$.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented at certain frequencies in other transistor technologies that provide complementary (e.g., P and N type transistors) switching devices, such as bipolar, LDMOS, BCD, and GaAs HBT technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency mixer driver circuit, including:
   (a) an input configured to receive an applied lower frequency base oscillator signal having a first phase;
   (b) a first complementary frequency multiplier module coupled to the input and configured to generate a first output signal at twice the frequency of the applied lower frequency base oscillator signal, the first complementary frequency multiplier module including an N-type transistor and a P-type transistor coupled in parallel and having gates controlled by the applied lower frequency base oscillator signal;
   (c) a second complementary frequency multiplier module coupled to the input and configured to generate a second output signal at twice the frequency of the applied lower frequency base oscillator signal, the second complementary frequency multiplier module including an N-type transistor and a P-type transistor coupled in parallel and having gates controlled by the applied lower frequency base oscillator signal; and
   (d) a parallel resonant filter/coupling circuit having a first input coupled to the first output signal and a second input coupled to the second output signal, the filter/coupling circuit being configured to filter out harmonic frequencies from the first and second output signals, wherein the parallel resonant filter/coupling circuit includes:
(a) a first inductor and a second inductor series coupled between the first input and the second input of the parallel resonant filter/coupling circuit;
(b) a capacitor coupled between the first input and the second input of the parallel resonant filter/coupling circuit and in parallel with the first and a second inductors; and
(c) a shunt capacitor coupled to between circuit ground and a node between the first and a second inductors;
wherein the first output signal and the second output signal have opposite phasing.

2. The invention of claim 1, wherein the N-type transistors and P-type transistors include one or more series-coupled FET devices.

3. The invention of claim 1, further including a first amplifier coupled between the first complementary frequency multiplier module and the first input of the parallel resonant filter/coupling circuit, and a second amplifier coupled between the second complementary frequency multiplier module and the second input of the parallel resonant fil-ter/coupling circuit.

4. The invention of claim 3, wherein the first and second amplifiers are common-gate FET amplifiers.

5. The invention of claim 4, wherein the common-gate FET amplifiers include a stack of series-coupled FET devices.

6. The invention of claim 1, wherein the parallel resonant filter/coupling circuit has a pass band with a resonant frequency at twice the frequency of the applied lower frequency base oscillator signal.

7. The invention of claim 1, wherein the parallel resonant filter/coupling circuit presents a high impedance at twice the frequency of the applied lower frequency base oscillator signal and a lower impedance at other frequencies.

8. The invention of claim 1, further including a mixer core having a first input node coupled to the first output and the parallel resonant filter/coupling circuit, and second input node coupled to the second output and the parallel resonant filter/coupling circuit.

9. The invention of claim 8, wherein the mixer core includes one of a diode-ring or a quad-FET ring.

10. A radio frequency mixer circuit, including:
(a) an input configured to receive an applied lower frequency base oscillator signal having a first phase;
(b) a first complementary frequency multiplier module coupled to the input and configured to generate a first output signal at twice the frequency of the applied lower frequency base oscillator signal, the first complementary frequency multiplier module including an N-type transistor and a P-type transistor coupled in parallel and having gates controlled by the applied lower frequency base oscillator signal;
(c) a second complementary frequency multiplier module coupled to the input and configured to generate a second output signal at twice the frequency of the applied lower frequency base oscillator signal, the second complementary frequency multiplier module including an N-type transistor and a P-type transistor coupled in parallel and having gates controlled by the applied lower frequency base oscillator signal;
(d) a parallel resonant filter/coupling circuit having a first input coupled to the first output signal and a second input coupled to the second output signal, the filter/coupling circuit being configured to filter out harmonic frequencies from the first and second output signals; wherein the parallel resonant filter/coupling circuit includes:
(a) a first inductor and a second inductor series coupled between the first input and the second input of the parallel resonant filter/coupling circuit;
(b) a capacitor coupled between the first input and the second input of the parallel resonant filter/coupling circuit and in parallel with the first and a second inductors; and
(c) a shunt capacitor coupled to between circuit ground and a node between the first and a second inductors; and
(e) a mixer core having a first input node coupled without a balun to the first output and the parallel resonant filter/coupling circuit, and a second input node coupled without a balun to the second output and the parallel resonant filter/coupling circuit;
wherein the first output signal and the second output signal have opposite phasing.

11. The invention of claim 10, wherein the mixer core includes one of a diode-ring or a quad-FET ring.

12. The invention of claim 10, wherein the N-type transistors and P-type transistors include one or more series-coupled FET devices.

13. The invention of claim 10, further including a first amplifier coupled between the first complementary frequency multiplier module and the first input of the parallel resonant filter/coupling circuit, and a second amplifier coupled between the second complementary frequency multiplier module and the second input of the parallel resonant fil-ter/coupling circuit.

14. The invention of claim 13, wherein the first and second amplifiers are common-gate FET amplifiers.

15. The invention of claim 14, wherein the common-gate FET amplifiers include a stack of series-coupled FET devices.

16. The invention of claim 10, wherein the parallel resonant filter/coupling circuit has a pass band with a resonant frequency at twice the frequency of the applied lower frequency base oscillator signal.

17. The invention of claim 10, wherein the parallel resonant filter/coupling circuit presents a high impedance at twice the frequency of the applied lower frequency base oscillator signal and a lower impedance at other frequencies.

* * * * *